(12) United States Patent  
Chang et al.

(10) Patent No.: US 11,114,387 B2  
(45) Date of Patent: Sep. 7, 2021

(54) ELECTRONIC PACKAGING STRUCTURE

(71) Applicant: INDUSTRIAL TECHNOLOGY RESEARCH INSTITUTE, Hsinchu (TW)

(72) Inventors: Jing-Yao Chang, Hsinchu (TW); Tao-Chih Chang, Hsinchu (TW); Fang-Jun Leu, Hsinchu (TW); Wei-Kuo Han, Hsinchu (TW); Kuo-Shu Kao, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 86 days.

(21) Appl. No.: 16/108,272

(22) Filed: Aug. 22, 2018

(65) Prior Publication Data

US 2018/0358307 A1 Dec. 13, 2018

Related U.S. Application Data

(63) Continuation-in-part of application No. 15/487,754, filed on Apr. 14, 2017, now abandoned.

(30) Foreign Application Priority Data

Feb. 15, 2017 (TW) .................................. 106104871

(51) Int. Cl.
*H01L 23/00* (2006.01)

(52) U.S. Cl.
CPC ............ *H01L 23/562* (2013.01); *H01L 24/29* (2013.01); *H01L 24/32* (2013.01); *H01L 24/33* (2013.01);

(Continued)

(58) Field of Classification Search
CPC ....... H01L 24/31; H01L 23/562; H01L 24/29; H01L 24/32; H01L 24/33; H01L 24/83;
(Continued)

(56) References Cited

U.S. PATENT DOCUMENTS

| 5,150,197 A | 9/1992 | Hamburgen |
| 6,372,544 B1* | 4/2002 | Halderman ........... H01L 21/563 |
| | | 257/E21.503 |

(Continued)

FOREIGN PATENT DOCUMENTS

| CN | 2849967 | 12/2006 |
| CN | 101051628 | 10/2007 |

(Continued)

OTHER PUBLICATIONS

English translation jp2008034514 Endo.*

(Continued)

*Primary Examiner* — Latanya N Crawford Eason
(74) *Attorney, Agent, or Firm* — Amin, Turocy & Watson, LLP (57) ABSTRACT

An electronic package structure is provided. The electronic packaging structure includes a substrate, a conductive layer disposed on the substrate, an intermetallic compound disposed on the conductive layer, a stress buffering material disposed on the substrate and adjacent to the conductive layer, and an electronic device disposed on the conductive layer and the stress buffering material. The intermetallic compound is disposed between the electronic device and the conductive layer, between the electronic device and the stress buffering material, between the substrate and the stress buffering material, and between the conductive layer and the stress buffering material. A maximum thickness of the intermetallic compound disposed between the electronic device and the stress buffering material, between the sub- (Continued)

strate and the stress buffering material, and between the conductive layer and the stress buffering material is greater than the thickness of the intermetallic compound disposed between the electronic device and the conductive layer.

5 Claims, 5 Drawing Sheets (52) U.S. Cl.
CPC .............. *H01L 24/83* (2013.01); *H01L 24/05* (2013.01); *H01L 2224/04026* (2013.01); *H01L 2224/05013* (2013.01); *H01L 2224/05639* (2013.01); *H01L 2224/05644* (2013.01); *H01L 2224/05647* (2013.01); *H01L 2224/05655* (2013.01); *H01L 2224/291* (2013.01); *H01L 2224/29011* (2013.01); *H01L 2224/2919* (2013.01); *H01L 2224/29076* (2013.01); *H01L 2224/29139* (2013.01); *H01L 2224/29144* (2013.01); *H01L 2224/29147* (2013.01); *H01L 2224/29155* (2013.01); *H01L 2224/32503* (2013.01); *H01L 2224/32505* (2013.01); *H01L 2224/33505* (2013.01); *H01L 2224/83203* (2013.01); *H01L 2224/83439* (2013.01); *H01L 2924/014* (2013.01); *H01L 2924/12* (2013.01); *H01L 2924/13056* (2013.01); *H01L 2924/13062* (2013.01); *H01L 2924/13091* (2013.01); *H01L 2924/3512* (2013.01)

(58) Field of Classification Search
CPC ............... H01L 24/04; H01L 24/05; H01L 2224/05075; H01L 2224/05078; H01L 2224/05082; H01L 2224/05083; H01L 2224/05092; H01L 2224/05007; H01L 2224/05005; H01L 2224/05013; H01L 2224/29076; H01L 2224/2075; H01L 2924/3512

See application file for complete search history.

(56) References Cited

U.S. PATENT DOCUMENTS

| | | | |
|---|---|---|---|
| 6,635,957 | B2 | 10/2003 | Kwan et al. |
| 6,727,587 | B2 | 4/2004 | Riedl |
| 6,784,024 | B2 | 8/2004 | Jiang |
| 6,946,744 | B2 | 9/2005 | Maxwell et al. |
| 7,042,103 | B2 | 5/2006 | Condie et al. |
| 7,888,782 | B2 | 2/2011 | Nelle et al. |
| 7,969,004 | B2* | 6/2011 | Ohnishi .................. H01L 24/11 257/737 |
| 8,120,188 | B2 | 2/2012 | Sakurai et al. |
| 8,283,756 | B2 | 10/2012 | Galesic et al. |
| 8,299,616 | B2* | 10/2012 | Chuang .................. H01L 21/50 257/758 |
| 8,736,052 | B2 | 5/2014 | Oeschler et al. |
| 9,698,052 | B2 | 7/2017 | Harikai et al. |
| 2009/0091030 | A1 | 4/2009 | Ohnishi |
| 2011/0120769 | A1 | 5/2011 | Sakatani et al. |
| 2011/0186986 | A1 | 8/2011 | Chuang et al. |
| 2011/0309512 | A1 | 12/2011 | Gejima et al. |
| 2012/0007231 | A1 | 1/2012 | Chang |
| 2013/0037967 | A1* | 2/2013 | Kim ........................ H01L 24/29 257/783 |
| 2013/0043585 | A1 | 2/2013 | Wakiyama et al. |
| 2013/0228905 | A1 | 9/2013 | von Koblinski et al. |
| 2014/0124929 | A1 | 5/2014 | Lin et al. |
| 2015/0043175 | A1* | 2/2015 | Choi ........................ H01L 23/48 361/749 |
| 2015/0140806 | A1* | 5/2015 | Radulescu ........ H01L 21/32139 438/627 |
| 2015/0179615 | A1 | 6/2015 | Watanabe et al. |
| 2015/0194373 | A1 | 7/2015 | Otremba et al. |
| 2016/0071743 | A1 | 3/2016 | How et al. |
| 2016/0219721 | A1 | 7/2016 | Sakai |
| 2016/0276302 | A1* | 9/2016 | Ohashi ............... B23K 35/0238 |
| 2016/0284660 | A1* | 9/2016 | Fukami .................... H01L 24/29 |
| 2017/0098590 | A1 | 4/2017 | Harikai et al. |
| 2017/0229384 | A1 | 8/2017 | Harikai et al. |
| 2017/0229385 | A1 | 8/2017 | Harikai et al. |
| 2018/0229333 | A1* | 8/2018 | Hino .................. C08G 59/4207 |

FOREIGN PATENT DOCUMENTS

| | | | |
|---|---|---|---|
| CN | 101615607 | | 12/2009 |
| CN | 102142418 | | 8/2011 |
| CN | 102891130 | | 1/2013 |
| CN | 105122957 | | 12/2015 |
| JP | 2008034514 | A * | 2/2008 |
| TW | 201526309 | | 7/2015 |
| TW | I550918 | | 8/2016 |

OTHER PUBLICATIONS

Chinese Office Action for Chinese Patent Application No. 201710217037.3 dated Jun. 10, 2019.
Universal high-temperature suitable joint adapting diffusion soldering, Joerg Strogies, Klaus Wilke, 2014 Electronics System-Integration Technology Conference (ESTC), Sep. 2014, 1-7.
Modeling, design and demonstration of ultra-short and ultra-fine pitch metastable Cu—Sn interconnections with high-throughput SLID assembly, Ting-Chia Huang, Vanessa Smet, Satomi Kawamoto, Venky Sundaram, P. Markondeya Raj, Rao R. Tummala, 2015 Electronic Components and Technology Conference (ECTC), May 2015, 1377-1384.
Taiwanese Office Action for Taiwanese Patent Application No. 106104871 dated Jun. 6, 2017.
Non-Final Office Action for U.S. Appl. No. 15/487,754 dated Sep. 11, 2017.
Final Office Action for U.S. Appl. No. 15/487,754 dated Mar. 22, 2018.

* cited by examiner

ELECTRONIC PACKAGING STRUCTURE

CROSS-REFERENCE TO RELATED APPLICATIONS

This application is a Continuation-in-Part application of and claims the priority benefit of a prior U.S. application Ser. No. 15/487,754, filed on Apr. 14, 2017, the entirety of which is hereby incorporated by reference herein.

This application claims the priority benefit of Taiwan application serial no. 106104871, filed on Feb. 15, 2017.

TECHNICAL FIELD

The technical field relates to an electronic packaging structure, and a technique improving the reliability thereof.

BACKGROUND

With the flourishing development of the electronic industry, electronic products are facing gradually towards multi-function and high-performance trends. Currently, the technologies of chip packaging are such as chip scale package (CSP), direct chip attached (DCA), the flip-chip typed packaging module of multi-chip module (MCM), and the wafer stacking technology of 3-dimensional integrated circuits (3DIC).

Figure 1:
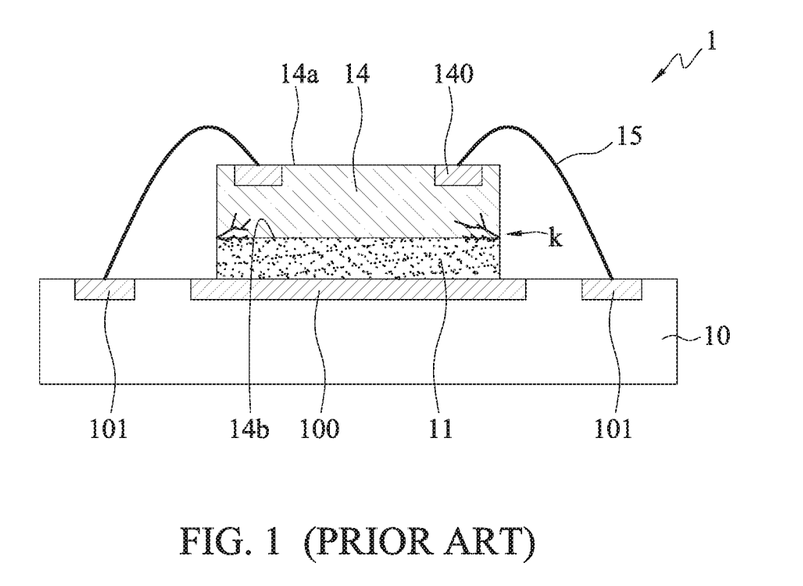
FIG. 1 is a cross-sectional schematic view of a general semiconductor packaging structure.

In known technologies of semiconductor packaging, for example, wire bonding packaging technique is shown in FIG. 1. A semiconductor packaging structure 1 comprises an inactive surface 14b of a semiconductor wafer 14 bonded with a pad 100 of a package substrate 10 through a bonding layer 11. Electrodes 140 of an active surface 14a of the semiconductor wafer 14 are electrically connected to a wiring layer 101 of the package substrate 10 by using the aforesaid wire bonding process to form a plurality of wires 15. Thereafter, the package substrate 10 may be electrically connected to a circuit board (not shown) or an external device (not shown) by a solder ball (not shown) formed on the bottom side of the package substrate 10.

The general semiconductor packaging structure 1 is operating at high temperatures with a severe creep effect. This does not facilitate to maintain the mechanical strength of the solder bonding, thereby failing to meet the reliability required by the module. The mechanical stress is another cause of damage to the module. Therefore, after the semiconductor wafer 14 is bounded with the bonding layer 11, the ability to withstand thermal stress and mechanical stress between the semiconductor wafer 14 and the bonding layer 11 becomes weaker. Specifically, a cracked position k is at the bonding position of an outer edge of the semiconductor wafer 14, as shown in FIG. 1.

Therefore, how to overcome the existing problems of known technologies is one of important issues.

SUMMARY

An exemplary embodiment of the disclosure relates to an electronic packaging structure. The electronic packaging structure includes a substrate, a conductive layer, a stress buffering material, an electronic device and an intermetallic compound. The conductive layer is disposed on the substrate. The stress buffering material is disposed on the substrate and adjacent to the conductive layer. The electronic device is disposed on the conductive layer and the stress buffering material. The intermetallic compound is disposed between the electronic device and the conductive layer, between the electronic device and the stress buffering material, between the substrate and the stress buffering material, and between the conductive layer and the stress buffering material. The intermetallic compound disposed between the electronic device and the conductive layer has a first thickness. A maximum thickness of the intermetallic compound disposed between the electronic device and the stress buffering material, between the substrate and the stress buffering material, and between the conductive layer and the stress buffering material is a second thickness. The second thickness is greater than the first thickness.

An exemplary embodiment of the disclosure relates to an electronic packaging structure. The electronic packaging structure includes a substrate, a conductive layer, a stress buffering material, an electronic device and an intermetallic compound. The conductive layer is disposed on the substrate. The stress buffering material is disposed on the substrate and adjacent to the conductive layer. The electronic device is disposed on the conductive layer and the stress buffering material. The intermetallic compound is disposed between the electronic device and the conductive layer. The intermetallic compound has a first width and a first thickness, the electronic device has a second width, and the conductive layer has a third thickness. When a ratio of the first width to the second width is fixed substantially, a ratio of the first thickness to the third thickness ranges from 1/10 to 1/2.

An exemplary embodiment of the disclosure relates to an electronic packaging structure. The electronic packaging structure includes a substrate, a conductive layer disposed on the substrate, an intermetallic compound disposed on the conductive layer, a stress buffering material and an electronic device. The stress buffering material is disposed on the substrate and adjacent to the conductive layer. The electronic device is disposed on the intermetallic compound and the stress buffering material, and the electronic device is in direct contact with the intermetallic compound. Wherein a space between the substrate and the electronic device is completely filled with the conductive layer, the intermetallic compound and the stress buffering material.

The foregoing will become better understood from a careful reading of a detailed description provided herein below with appropriate reference to the accompanying drawings.

BRIEF DESCRIPTION OF THE DRAWINGS

FIG. 2' is a bottom schematic view of the electronic packaging structure of FIG. 2.

FIG. 3' is a bottom schematic view of an electronic packaging structure of FIG. 3.

DESCRIPTION OF THE EMBODIMENTS

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
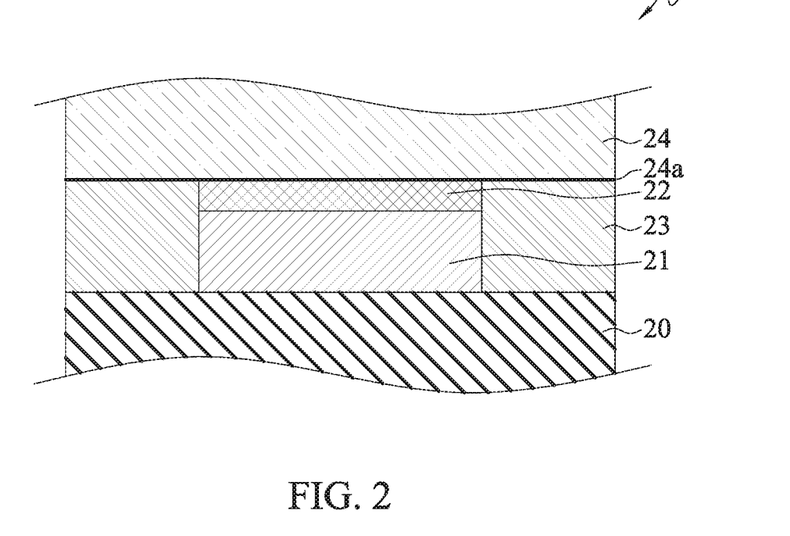
FIG. 2 is a cross-sectional schematic view of an electronic packaging structure according to an embodiment of the disclosure.

FIG. 2 is a cross-sectional schematic view of an electronic packaging structure according to an embodiment of the disclosure. Referring to FIG. 2, in the embodiment, an electronic packaging structure 2 comprises a substrate 20, a conductive layer 21, an intermetallic compound (IMC) 22, a stress buffering material 23 and an electronic device 24.

The substrate 20 is a metal board such as a gold board, a silver board, a copper board or a nickel board.

The conductive layer 21 is disposed on the substrate 20 and comprises a metal material. In the embodiment, the metal material is, for example, silver. The conductive layer 21 is a silver layer of various states. In other embodiments, the metal material of the conductive layer 21 may be, but not limited to gold, copper, nickel or other metal materials. However, the material of the conductive layer 21 is not limited thereto, and the material of the conductive layer 21 only need to meet the characteristics of the low thermal resistance and/or high thermal conductivity, low impedance, low temperature assembly and/or high temperature applications, high temperature resistant (greater than 400° C.) and so on. The material of the conductive layer 21 and the substrate 20 may be the same or different.

The intermetallic compound 22 is disposed on the conductive layer 21. In the embodiment, the intermetallic compound 22 is a structure generated between the electronic device 24 and the conductive layer 21 after the electronic device 24 is thermally bonded with (solder bonded) the conductive layer 21. Therefore, the material of the intermetallic compound 22 depends on the solder material of the stress buffering material 23.

The stress buffering material 23 is disposed on the substrate 20 and adjacent to the conductive layer 21. Also, the stress buffering material 23 may be adjacent to the intermetallic compound 22. In the manufacture processing, the stress buffering material 23 is coated with the side surface and the top surface of the conductive layer 21. After the electronic device 24 is disposed on the stress buffering material 23, the electronic device 24 is bonded with the stress buffering material 23 by a thermal compression bonding. And the stress buffering material 23 on the top surface of the conductive layer 21 reacts with the conductive layer 21 and a metal layer 24a on the back of the electronic device 24 to form the intermetallic compound 22 to bond with the electronic device 24. The material of the metal layer 24a is, for example, nickel, copper, silver or other weldable metal materials to bond with the soldering material used of the stress buffering material 23.

In the embodiment, the stress buffering material 23 comprises a solder, such as lead-free solder, high-temperature solder and so on.

Furthermore, the stress buffering material 23 surrounds the side surface of the conductive layer 21. Also, based on requirements, the stress buffering material 23 may surround the side surface of the intermetallic compound 22.

The electronic device 24 is disposed on the intermetallic compound 22 and the stress buffering material 23, and the electronic device 24 is in contact with the intermetallic compound 22. Also, based on requirements, the electronic device 24 may be in contact with the stress buffering material 23.

In the embodiment, the electronic device 24 is a semiconductor device. Take a SiC power semiconductor device as an example, the electronic device 24 may be, for example, metal-oxide-semiconductor field-effect transistor (MOSFET), insulated gate bipolar transistor (IGBT), junction field-effect transistor (JFET) or diode.

Furthermore, the electronic device 24 uses the intermetallic compound 22 and the conductive layer 21 as a ground path or a heat dissipation path.

In addition, an area D of the stress buffering material 23 within a frontal projected area A of the electronic device 24 ranges from 1% to 50% of the frontal projected area A, as shown in FIG. 2 and FIG. 2'.

In the electronic packaging structure 2, the conductive layer 21 may serve as a heat dissipation, while the stress buffering material 23 may also serve as a stress buffer, wherein the side surface of the conductive layer 21 is surrounded by the stress buffering material 23 to avoid stress is transmitted to the side of the electronic device 24. Therefore, compared with known arts, the electronic packaging structure 2 may enhance the effect of stress buffering in order to effectively prevent the electronic device 24 from being cracked from its side wall due to the stress such as a stress known from the thermal stress of the motor.

Figure 3:
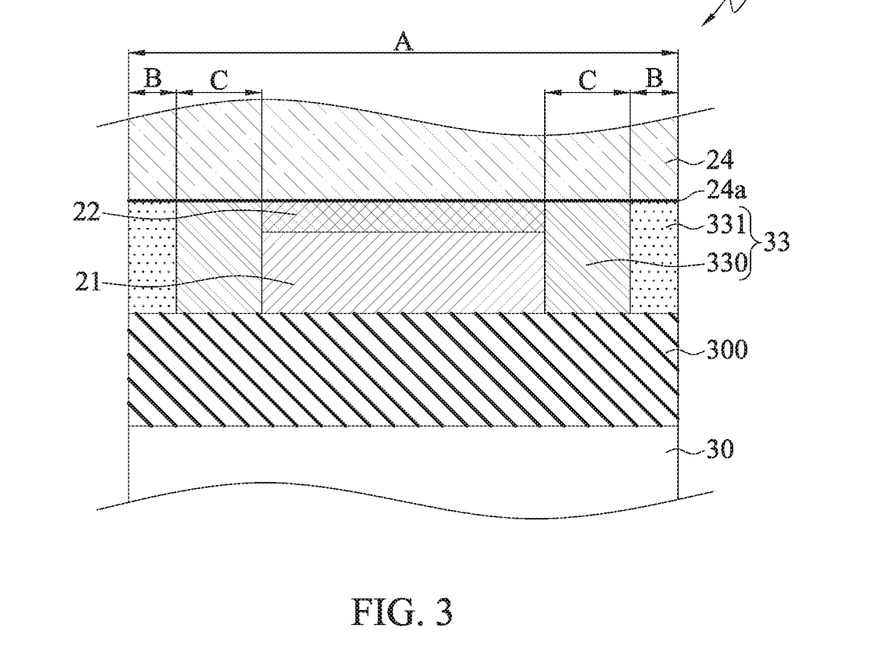
FIG. 3 is a cross-sectional schematic view of an electronic packaging structure according to another embodiment of the disclosure.

FIG. 3 is a cross-sectional schematic view of an electronic packaging structure according to another embodiment of the disclosure. The embodiment of FIG. 3 is similar to the embodiment of FIG. 2. Like reference numerals refer to like elements, and the same description will not be repeated herein. The difference between the two embodiments is the design of the substrate and the stress buffering material.

Referring to FIG. 3, in the embodiment, an electronic packaging structure 3 comprises a substrate 30 and a stress buffering material 33. The substrate 30 has a bonding pad 300 for bonding with the conductive layer 21. The stress buffering material 33 comprises a solder 330 and an organic material 331.

The bonding pad 300 is a metal pad such as a copper pad. The substrate 30 has a wire layer (not shown) electrically connected or not electrically connected to the bonding pad 300, which may depend on requirements.

In the embodiment, the material of the substrate 30 is a ceramic material or an organic material such as a glass fiber resin, a dielectric material, a printed circuit board and so on. However, the material of the substrate 30 is not limited thereto.

The organic material 331 is an insulating material such as silicone or epoxy-based material.

In the embodiment, wherein a sum (B+C) of the area B of the organic material 331 and the area C of the solder 330 within a frontal projected area A of the electronic device 24 ranges from 1% to 50% of the frontal projected area A, as shown in FIG. 3 and FIG. 3'.

In the electronic packaging structure 3, the conductive layer 21 may serve as a heat dissipation, while the stress buffering material 33 may also serve as a stress buffer, wherein the side surface of the conductive layer 21 is surrounded by the stress buffering material 33 to avoid stress is transmitted to the side of the electronic device 24. Therefore, compared with known arts, the electronic packaging structure 3 may enhance the effect of stress buffering in order to effectively prevent the electronic device 24 from being cracked from its side wall due to the stress such as a stress known from the thermal stress of the motor.

Figure 4:
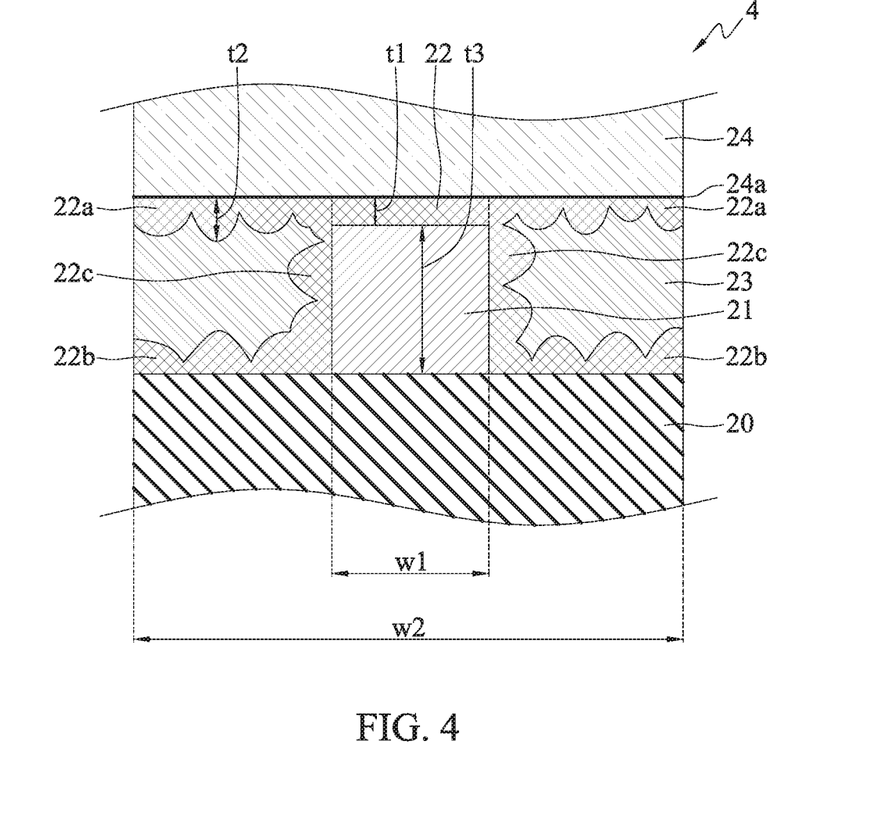
FIG. 4 is a cross-sectional schematic view of an electronic packaging structure according to an alternative embodiment of the disclosure.

FIG. 4 is a cross-sectional schematic view of an electronic packaging structure according to an alternative embodiment of the disclosure. The embodiment of FIG. 4 is similar to the embodiment of FIG. 2. Like reference numerals refer to like elements, and the same description will not be repeated herein. The differences between the two embodiments are the disposed position and the distribution of the intermetallic compound.

Referring to FIG. 4, in the embodiment, an electronic packaging structure 4 comprises intermetallic compounds 22, 22a, 22b and 22c. Specifically, the intermetallic compound 22 is a structure generated between the metal layer 24a of the electronic device 24 and the conductive layer 21. And the intermetallic compound 22 is disposed between the electronic device 24 and the conductive layer 21. The intermetallic compound 22a is a structure generated between the metal layer 24a of the electronic device 24 and the stress buffering material 23. And the intermetallic compound 22a is disposed between the electronic device 24 and the stress buffering material 23. The intermetallic compound 22b is a structure generated between the substrate 20 and the stress buffering material 23. And the intermetallic compound 22b is disposed between the substrate 20 and the stress buffering material 23. The intermetallic compound 22c is a structure generated between the conductive layer 21 and the stress buffering material 23. And the intermetallic compound 22c is disposed between the conductive layer 21 and the stress buffering material 23.

Generally, a shape of the intermetallic compound 22 disposed between the electronic device 24 and the conductive layer 21 is not a specific shape. Thus a distance between the electronic device 24 and the conductive layer 21 is substantially equal to a first thickness t1 of the intermetallic compound 22. Each of shapes of the intermetallic compounds 22a, 22b, and 22c is formed by, for example, a plurality of scallop-like connections or a plurality of column-like connections, but not limited thereto. In one of exemplary embodiments of this disclosure, at least one of shapes of the intermetallic compounds 22a, 22b, and 22c is formed by, for example, a plurality of scallop-like connections or a plurality of column-like connections. A maximum thickness of the intermetallic compounds 22a, 22b, and 22c is a second thickness t2. The second thickness t2 is greater than the first thickness t1.

The intermetallic compound 22 has the same thickness at different positions substantially. That is, the first thickness t1 at the edge of the intermetallic compound 22 is equal to the first thickness t1 at the center of the intermetallic compound 22 substantially. Each of the intermetallic compounds 22a, 22b, and 22c has a same distribution at different positions of the intermetallic compound substantially. For example, the intermetallic compound 22a adjacent to or away from the conductive layer 21 has the same distribution substantially.

Furthermore, the width of the conductive layer 21 is equal to a first width w1 of the intermetallic compound 22 substantially. The width of the electronic device 24 is a second width w2. The thickness of the conductive layer 21 is a third thickness t3. When a ratio of the first width w1 to the second width w2 (w1/w2) is fixed substantially, a ratio of the first thickness t1 to the third thickness t3 (t1/t3) ranges from 1/10 to 1/2. Therefore, the electronic packaging structure 4 may enhance the effect of stress buffering.

In addition, the area D of the stress buffering material 23 within the frontal projected area A of the electronic device 24 ranges from 10% to 50% of the frontal projected area A. Therefore, the electronic packaging structure 4 may enhance the effect of stress buffering.

Examples are cited to validate the efficacy of the present disclosure, but the scope of the present disclosure being indicated may be, but not limited to these experimental examples set forth herein.

Figure 5:
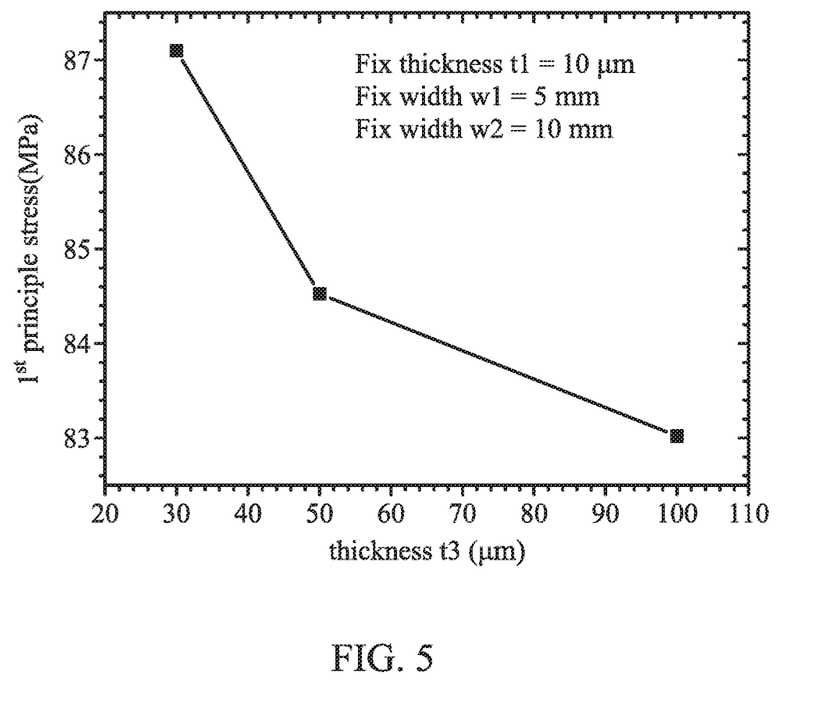
FIG. 5 shows a stress buffering example of the electronic packaging structure of FIG. 4 of the disclosure.

FIG. 5 shows a stress buffering example of the electronic packaging structure of FIG. 4 of the disclosure. The relationship between the stress of the intermetallic compound 22 and the ratio of the first thickness t1 to the third thickness t3 (t1/t3) are illustrated. The first width w1 of the intermetallic compound 22 is 5 mm. The second width w2 of the electronic device 24 is 10 mm. The first thickness t1 of the intermetallic compound 22 is 10 um. When the third thickness t3 of the conductive layer 21 is gradually increased from 30 um to 100 um, the stress of the intermetallic compound 22 is gradually reduced. That is, the greater the third thickness t3 of the conductive layer 21 is, the smaller the stress of the intermetallic compound 22 is. In general, the third thickness t3 of the conductive layer 21 is allowed to range from 20 um to 110 um.

As aforesaid, in the embodiments of the electronic packaging structure of the present disclosure, the stress buffering material is adjacent to the conductive layer to have the conductive layer and the stress buffering material together serving as a stress buffer. This may effectively prevent the electronic device from being cracked by the stress so as to enhance the effect of the stress buffer, thereby improving the reliability of the electronic packaging structure.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An electronic packaging structure, comprising:
   a substrate;
   a conductive layer disposed on the substrate;
   a stress buffering material disposed on the substrate and adjacent to the conductive layer;
   an electronic device disposed on the conductive layer and the stress buffering material; and
   an intermetallic compound disposed between the electronic device and the conductive layer, between the electronic device and the stress buffering material, between the substrate and the stress buffering material, and between the conductive layer and the stress buffering material,
   wherein the intermetallic compound disposed between the electronic device and the conductive layer has a first thickness; a maximum thickness of the intermetallic compound disposed between the electronic device and the stress buffering material, between the substrate and the stress buffering material, and between the conductive layer and the stress buffering material is a second thickness; and the second thickness is greater than the first thickness.

2. The electronic packaging structure as claimed in claim 1, wherein the intermetallic compound disposed between the electronic device and the conductive layer has a same thickness at different positions substantially.

3. The electronic packaging structure as claimed in claim 1, wherein at least one of shapes of the intermetallic compounds disposed between the electronic device and the stress buffering material, between the substrate and the stress buffering material, and between the conductive layer and the stress buffering material is formed by a plurality of scallop-like connections or a plurality of column-like connections.

4. The electronic packaging structure as claimed in claim 1, wherein a distance between the electronic device and the conductive layer is substantially equal to the first thickness of the intermetallic compound between the electronic device and the conductive layer.

5. The electronic packaging structure as claimed in claim 1, wherein an area of the stress buffering material within a frontal projected area of the electronic device ranges from 10% to 50% of the frontal projected area.

* * * * *